(12) United States Patent
Gerstenmayer et al.

(10) Patent No.: US 7,196,333 B1
(45) Date of Patent: *Mar. 27, 2007

(54) RADIATION DETECTOR USING A COMPOSITE MATERIAL AND METHOD FOR MAKING SAME

(75) Inventors: Jean-Louis Gerstenmayer, Orsay (FR); Jean-Michel Nunzi, Murs Erigne (FR)

(73) Assignee: Commissariat a l'Energie Atomique, Paris (FR)

( * ) Notice: Subject to any disclaimer, the term of this patent is extended or adjusted under 35 U.S.C. 154(b) by 4 days.

This patent is subject to a terminal disclaimer.

(21) Appl. No.: 10/069,045

(22) PCT Filed: Sep. 22, 2000

(86) PCT No.: PCT/FR00/02634

§ 371 (c)(1),
(2), (4) Date: Feb. 21, 2002

(87) PCT Pub. No.: WO01/22505

PCT Pub. Date: Mar. 29, 2001

(30) Foreign Application Priority Data

Sep. 23, 1999 (FR) .................................. 99 11883

(51) Int. Cl.
*H01L 51/42* (2006.01)
(52) U.S. Cl. .............................. 250/370.1; 250/370.12
(58) Field of Classification Search ........... 250/370.12, 250/370.1
See application file for complete search history.

(56) References Cited

U.S. PATENT DOCUMENTS 6,727,503 B1  4/2004 Gerstenmayer ........ 250/370.09
6,878,944 B1  4/2005 Gerstenmayer et al. ..... 250/374

FOREIGN PATENT DOCUMENTS

| EP | 0917208 A1 * | 5/1999 |
| JP | 53096786 | 8/1978 |
| JP | 02143188 | 6/1990 |
| WO | WO 99/39395 A1 | 8/1999 |

OTHER PUBLICATIONS

J.S. Salafsky, et al., "Solid State Polymer-Semiconductor Nanocrystal Photovoltaic Devices", 2$^{ND}$ World Conference on Photovoltaic Solar Energy Conversion, Jul. 6-10, 1998, pp. 272-275, XP-002130865 Vienna, AT ISBN: 92-828-5179-6 le document en entire.

(Continued)

*Primary Examiner*—Constantine Hannaher
(74) *Attorney, Agent, or Firm*—Thelen Reid Brown Raysman & Steiner LLP

(57) ABSTRACT

A detector of radiation uses a composite material, and process manufactures the detector. The detector includes layers (6) of a semiconducting composite material including a host matrix made of a polymer and semiconducting-type guest particles dispersed through the host matrix, means (22–26) for creating an electric field in the layers, and a stack of sheets (4) of a first material emitting particles by interaction with the radiation, the layers alternating with the sheets, each of the layers being associated with one of the sheets, the stack having opposite faces, each containing the edges of the sheets and layers. The means for creating includes, for each layer, a group of parallel and conductive tracks (22) which extend from one face to the other, parallel to this layer, and which are in contact with it.

22 Claims, 5 Drawing Sheets

OTHER PUBLICATIONS

G. Yu, K. Pakbaz, et al., "Semiconducting Polymer Diodes: Large Size, Low Cost Photodetectors With Excellent Visible-Ultraviolet Sensitivity", Applied Physics Letters, US, American Institute of Physics, New York, vol. 64, No. 25, Jun. 20, 1994, pp. 3422-3424, XP000454599, ISSN: 0003-6951 le document en entire.

N. C. Greenham, et al., "Charge Separation And Transport In Conjugated-Polymer/Semiconductor-Nanocrystal Composites Studied by Photoluminescence Quenching And Photoconductivity", Physical Review, B. Condensed Matter, US, American Institute of Physics., New York, vol. 54, No. 24, Dec. 15, 1996, pp. 17628-17637, XP002060964, ISSN: 0163-1829 le document en entire.

J.M. Huang, et al., "Assembly And Applications of The Inorganic Nanocrystals in Polymer Networks", Thin Solid Films, Ch, Elsevier-Sequoia S.A. Lausanne, vol. 327/329, Aug. 31, 1998, pp. 536-540, XP000668864, ISSN: 0040-6090 le document en entire.

Jean-Louis Gerstenmayer, "High DQE Performance X-and Gama-ray Fast Imagers: Emergent Concepts", CEA, BP 12, F-91680 Bruyeres-le-Chatel (France), Nuclear Instruments and Methods in Physics Research A. North Holland, Amsterdam invited paper, submitted May 11, 1998, 6 pages.

Jean-Louis Gerstenmayer, et al., "Multi Step Parallel Plate Avalanche Chamber as a 2D Imager For MeV Pulsed Radiography", C.E.A. B.P 7, F-77181 Country, France; ESPCI, 10 rue Vauquelin, F-75005 Paris, SPIE vol. 2859, 8 pages.

Search Report, PCT/FR 00/02634 (Dec. 20, 2000), not a publication.

* cited by examiner

RADIATION DETECTOR USING A COMPOSITE MATERIAL AND METHOD FOR MAKING SAME

CROSS REFERENCE TO RELATED APPLICATIONS OR PRIORITY CLAIM

This application is a national phase of PCT/FR00/02634 which was filed on Sep. 22, 2000, which claims priority based on French Patent Application No. 99 11883, filed Sep. 23, 1999, and was not published in English. This application is related to U.S. patent application Ser. No. 09/926,328, which is now U.S. Pat. No. 6,727,503 issued Apr. 27, 2004, entitled "Two Dimensional Ionizing Radiation Detector and Method for the Production Thereof" in the name of Jean-Louis Gerstenmayer, a co-inventor of this application, and commonly owned with this application, which is a national phase of PCT/FR00/00917 filed on Apr. 11, 2000 which claims priority based on French Patent Application No. 99 04725, filed Apr. 15, 1999, and was not published in English.

TECHNICAL DOMAIN

The present invention relates to a detector of radiation together with a process for manufacturing this detector.

The invention applies in particular to two-dimensional detection of ionising radiations such as, for example, X-ray photons, gamma photons, protons, neutrons and muons.

In particular, it can be applied to radiography and radioscopy.

STATE OF PRIOR ART

In the field of X-ray imaging, there is a great demand for biomedical applications (X-rays with energies from 10 keV to 100 keV), for non destructive testing applications (X-rays with energies from 100 keV to 10 MeV) and nuclear instrumentation applications (X-ray energies from 0.5 MeV to 10 MeV).

Concerning the above applications, there is a need for detectors with large surfaces able to replace radiological films by digitised imaging systems (in which the images are stored under digital form).

For other applications, there is a need for producing detectors or sensors allowing ultra-rapid acquisition of images or time signals, the time of acquisition of an image being able to be as low as one pico-second, whilst the reading time may be longer.

From an economic point of view, there is also a need for panels of photo-sensors of very large format, permitting cost effectiveness for the photovoltaic effect for producing electrical energy.

Various laboratories are at present developing detectors using solid semiconductors (which can be monocrystalline or polycrystalline or even amorphous) as for example silicon, diamond (obtained by chemical deposit in vapour phase) CdTe or GaAs and their alloys.

All these solid semiconductors lead to detectors with high production costs, taking into account the time needed for the chemical deposit in vapour phase or the crystal growth of semiconductors.

Other detectors known in prior art use scintillation counters, but the latter need optical reading systems whose costs adds to that of the scintillation counters.

It is also known from prior art how to digitise the images which are recorded on a radiological film, but such a method requires a chemical development phase which rules out any real time diagnosis and also represents an incompressible part of the cost of implementation of this method.

DESCRIPTION OF THE INVENTION

The present invention relates to a detector of radiation, a detector capable of having a large surface and with low manufacturing cost.

In order to do this, the detector which is the aim of the invention uses a composite material whose host matrix is a polymer, a material which can be obtained inexpensively in the form of large surface layers.

Precisely, the aim of the present invention is a detector of incident ionising radiation constituted of primary particles, this detector being characterised in that it comprises:

layers of a semiconducting composite material comprising a host matrix made of a polymer and guest particles of the semiconductor type dispersed throughout the host matrix, at least these guest particles being capable of interacting directly or indirectly with the radiation, electric charges being produced in the layers of composite material from the interaction of the guest particles with the radiation, means for creating an electric field in the layers of composite material, the host matrix being capable of transporting the electric charges under the action of this electric field and thus making it possible to exploit these electric charges, and a stack of sheets of a first material which is capable of emitting secondary particles by interaction with the incident ionising radiation, the layers of composite material alternating with the sheets of the first material and being able to be ionized by the secondary particles, each of the layers being associated with one of the sheets, the stack having first and second opposite faces, each containing respective edges of sheets and layers, the detector being intended to be oriented such that the ionising radiation arrives on the first face, the length of each sheet, counted from the first to the second face, being at least equal to the tenth of the mean free path of the primary particles in the first material, the means for creating the electric field comprising, for each layer, a group of parallel and electrically conductive tracks which extend from the first to the second face, parallel to this layer, and which are in contact with it, the tracks also being intended to collect the charges produced in this layer by interaction between it and the secondary particles and possibly with the primary particles and which are representative, in intensity and in position, of the primary particles, the electric field also being capable of provoking the collection of charges by the tracks.

The polymer can be chosen from the group comprising semiconducting polymers and electrically insulating polymers.

Preferably, a polymer is chosen in which the mobility of the electric charges is higher than $10^{-6}$ cm$^2$/V/s.

Preferably this polymer is chosen from the group comprising polyphenylenevinylene (PPV), polythiophene, polyaniline, polypyrrol and polydiacetylene.

It can also be another biological molecule, for example DNA.

The guest particles can be able to produce electric charges by direct interaction with the incident radiation or by indirect interaction with the latter, for example by interaction with other electric charges produced by interaction of the incident radiation with the host matrix.

These guest particles can be chosen from the group comprising grains of at least one semiconductor powder and semiconducting colloidal particles.

Preferably, the guest particles have a mean atomic number higher than 14, an average density greater than 2 g·cm$^{-3}$ and an average relative permittivity greater than 10.

The guest particles can be coated in a material preventing their agglomeration.

According to a preferred embodiment of the invention, the first material is electrically conductive, the tracks are electrically insulated from the sheets and the means for creating the electric field furthermore comprise means for applying an electrical voltage between the tracks and the sheets, this voltage being capable of provoking the collection of charges by the tracks.

Preferably, each group of tracks is contained in the layer to which it is associated.

In this case, according to another preferred embodiment, the first material is electrically conductive and the means for creating the electric field furthermore comprise means for applying an electrical voltage between the tracks and the sheets, this voltage being capable of provoking the collection of charges by the tracks.

According to another preferred embodiment, the sheets are electrically insulated, an electrically conductive layer is interposed between each layer of composite semiconducting material and the sheet associated with it and the means of creation of the electric field furthermore comprise means for application of an electrical voltage between the tracks and the electrically conductive layers, this voltage being capable of provoking the collection of charges by the tracks.

The present invention also concerns a process for manufacturing the detector, the subject of the invention.

BRIEF DESCRIPTION OF THE DRAWINGS

The present invention will be better understood by reading the description of examples of embodiments given below, purely indicative and entirely non-limiting, with reference to the attached drawings in which.

DETAILED DESCRIPTION OF PARTICULAR EMBODIMENTS

Figure 1:
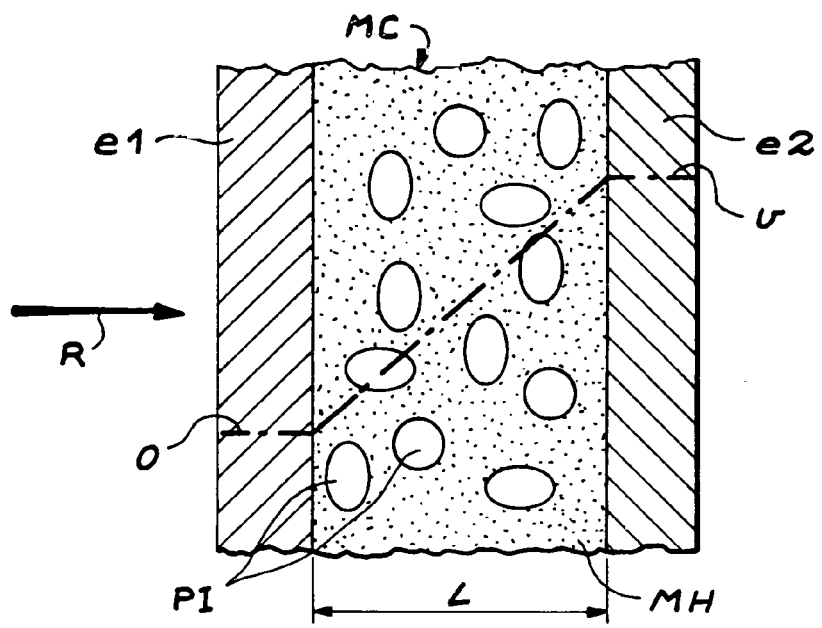
FIG. 1 is a diagrammatic and partial cross-section of a radiation detector useful for understanding the invention.

The radiation detector, which is diagrammatically and partially represented in cross-section in FIG. 1, is intended to detect an incident radiation R.

This detector comprises a layer of a composite material MC comprising a host matrix MH in which solid guest particles PI are dispersed. The thickness of this layer is for example of the order of 1 μm to 1 mm.

The detector also comprises two electrodes e1 and e2 between which the layer MC is comprised.

In the case where the radiation R must cross one of the electrodes e1 and e2 to reach the layer MC, this electrode (for example the electrode e1) must be made of a material allowing passage of this radiation R.

The host matrix M is made of a polymer. The implementation techniques for polymers make it possible to produce large surface layers (of the order of 1 m$^2$) at very low cost. In order to obtain such layers, one can proceed by painting, serigraphy, moulding, casting, quenching or deposit (for example by a projection technique) or in situ polymerisation on the particles.

The proportion of guest particles in the host matrix is, for example, of the order of 1% to 70% by volume according to the detector one wishes to form.

These guest particles are, if necessary, coated with a compound preventing their agglomeration.

The polymer of the host matrix M can be semiconducting or electrically insulating. The electric charges reach the electrodes through conduction in the first case and by capacitive induction in the second case.

Preferably one uses a polymer in which the electric charges have a mobility which is greater than $10^{-6}$ cm$^2$/V/s.

For example one can use a semiconducting polymer such as polyphenylenevinylene (PPV), polythiophene, polyaniline, polypyrrol or polydiacetylene. These polymers are all macro-molecules whose "skeleton" possesses a periodic alternation of single bonds and double or triple bonds between carbon atoms or hetero atoms such as nitrogen.

Such polymers are characterised by a high mobility of holes, of the order of $10^{-4}$ cm$^2$/V/s to 1 cm$^2$/V/s.

One can also use polyvinyl carbazole which is characterised by a mobility of holes which is greater than $10^{-6}$ cm$^2$/V/s.

An insulating polymer such as isooctane, with a high electron mobility, of the order of $10^{-4}$ cm$^2$/V/s to 1 cm$^2$/V/s can also be used.

The guest particles introduced into the host matrix have a high stopping power vis-à-vis the incident radiation R. Their function is to capture this radiation (which can be X-rays or gamma rays) and to convert them into electric charges.

Taking into account their function, these guest particles should have a mean atomic number, an average density and an average relative permittivity respectively higher than the mean atomic number, the average density and the average relative permittivity of the polymer.

Preferably, one uses guest particles with a mean atomic number higher than 14, an average density higher than 2 g·cm$^3$ and an average relative permittivity higher than 10.

Preferably, these guest particles come from a semiconductor powder (for example CdTe, ZnS, ZnSe or ZnTe), whose grains have sizes of the order of 1 nm to 100 μm, or even colloidal particles of this semiconductor.

Instead of a semiconductor, one can use a metal (for example Zn, Ag or Mg) in finely divided state or a photo-electric material (for example CsI or another material used for photo-cathodes), preferably in the ultra-divided state, to facilitate the exit of electrons produced under the impact of incident radiation.

One can even use grains of mixtures of powders of different nature or different granulometry.

The guest particles can also be chosen to convert ionizing particles into electrons as for example secondary electrons produced in the host matrix following the interaction of the latter with the incident radiation.

Thus one can detect particles such as neutrons, protons or α-particles (note that the polymer, which contains many protons, is capable of detecting these particles).

The electrodes are intended for application of the electric field allowing transport, through the host matrix, of charges produced by the guest particles. In certain detectors useful for understanding the invention, these electrodes furthermore make it possible to collect these charges and thus to measure the current produced by the incident radiation in the layer of composite material, which enables measurement of a dose rate.

These electrodes can be made of a metal (for example chromium, tungsten, silver or gold) or a semi-metal (for example indium oxide or ITO, that is to say indium oxide doped with tin) but their nature can also be imposed by secondary functions which they may also have to ensure, as will be seen below.

For example, if one wishes them to participate also in the conversion of the incident radiation into electrons, the material constituting these electrodes is chosen so as to have a high efficient cross-section vis-à-vis this radiation: for example, one chooses a heavy metal such as lead or tungsten.

The electric field applied, continuous or pulsed, to the layer of composite material through the intermediary of electrodes (and with an appropriate voltage source connected between the latter) is for example of the order of 0.1 V/μm to 100 V/μm.

In certain detectors useful for understanding the invention, the electrodes enable the definition of elementary points or pixels of these detectors. Thus these electrodes can form a metallic grid with nodes where the pixels are located.

Figure 2:
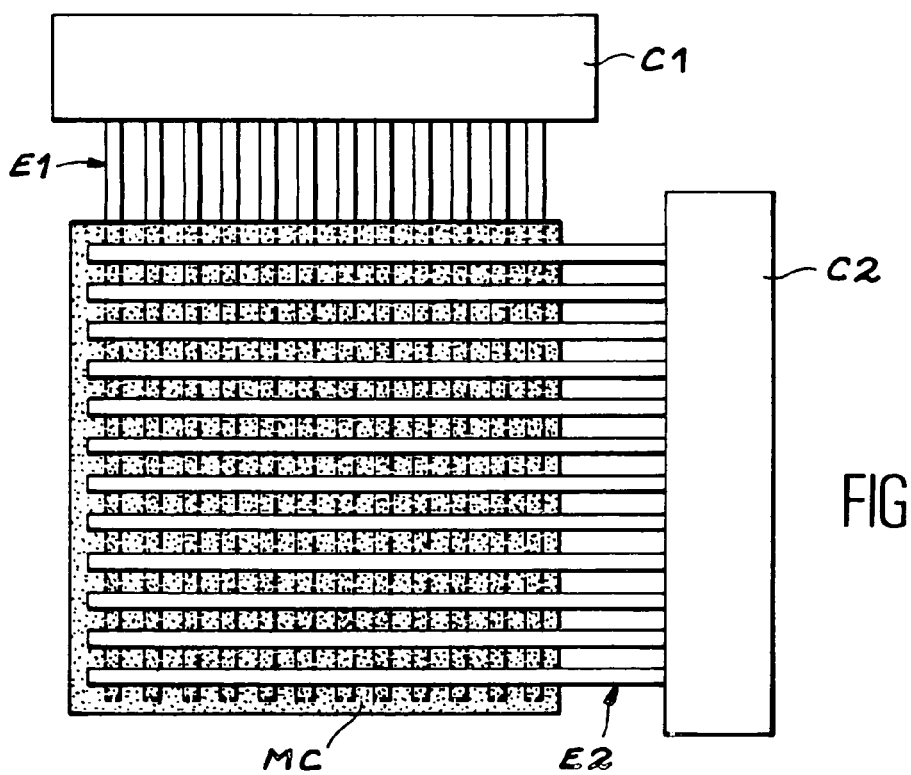
FIG. 2 is a diagrammatic view from above of a particular embodiment of a radiation detector useful for understanding the invention.

This is shown diagrammatically in FIG. 2 which provides, seen from above, a view of a detector useful for understanding the invention comprising a layer MC of composite material, a first row of parallel electrodes E1 which are formed on one face of this layer, and a second row of parallel electrodes E2 formed on the other face of the layer MC and which are perpendicular to the row of electrodes E1.

Circuits C1 and C2 are provided for polarising the electrodes of the detector in order to create the electric field at each crossing of electrodes.

In the case of FIG. 2, the pixels are simply defined by the electric field existing between the electrodes. This represents a counting type reading configuration. With point-shaped electrodes, as for example balls, tips or pads, arranged on a CCD or CMOS matrix, one can obtain a parallel reading mode of the images.

Figure 3:
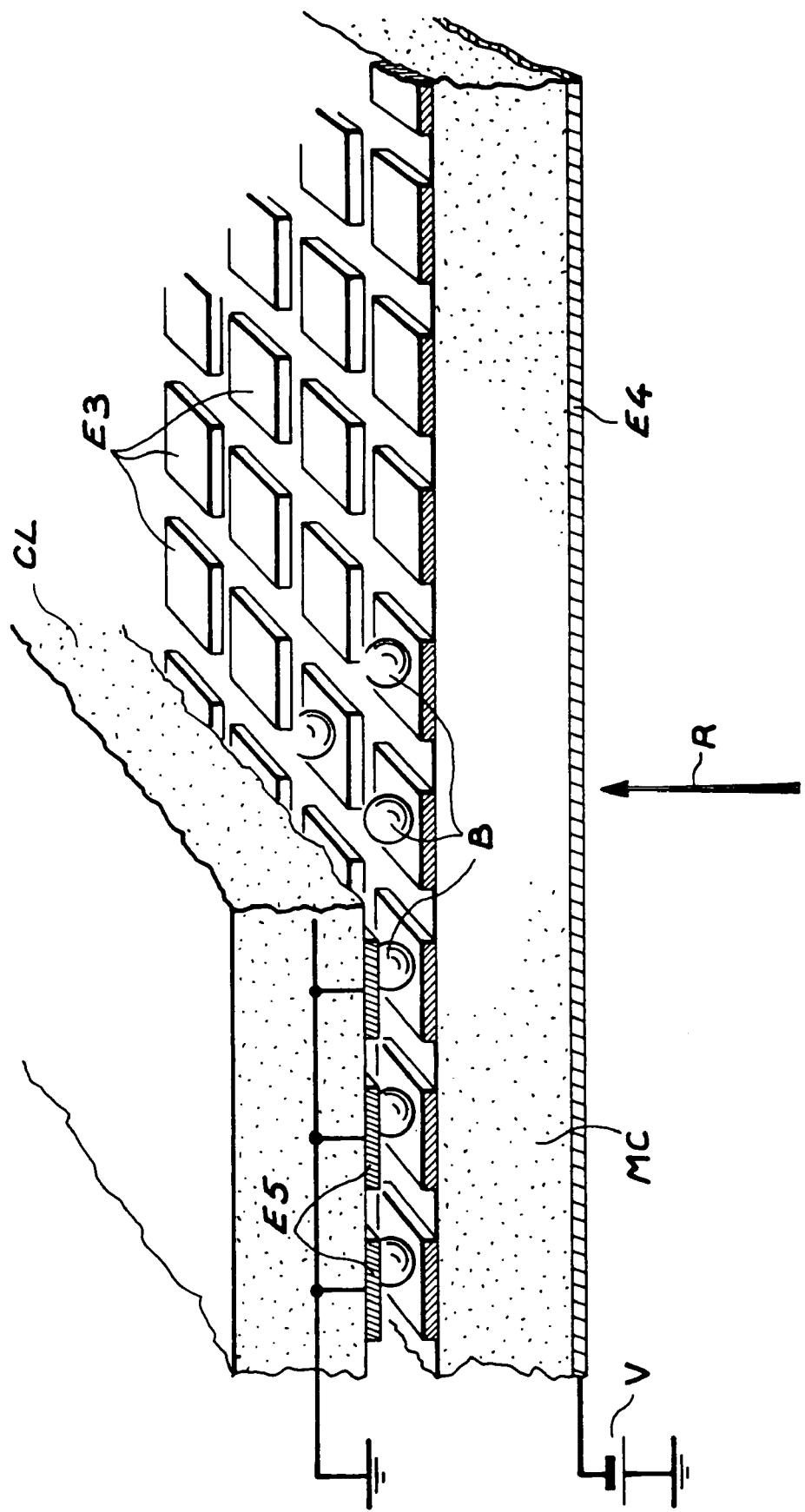
FIG. 3 is a diagrammatic and partial view in perspective of another particular embodiment of a radiation detector useful for understanding the invention.

This is shown diagrammatically in FIG. 3, in which one sees another detector useful for understanding the invention, comprising a layer MC of composite material, a two-dimensional array of electrodes E3 formed on one face of this layer and an electrode E4 constituting a counter-electrode and formed on the other face of the MC layer. The radiation 6 which one wishes to detect arrives in the direction of this layer E4 chosen to be transparent to this radiation.

Let us suppose that the charges produced by the guest particles under the impact of the incident radiation are electrons.

The electrodes E3 are then earthed and a voltage source V is provided to bring the electrode E4 to a negative potential to create the electric field between the electrode E4 and each electrode E3. Furthermore, an LC circuit of the CCD type is provided for reading the signals provided by the electrodes E3 when radiation is detected.

The LC circuit comprises a two-dimensional electrode array E5 forming pads which are respectively connected to the pads E3 through the intermediary of brazed balls B. Furthermore, the pads E5 (and thus the pads E3) are earthed.

One now returns to the operation of a detector useful for understanding the invention. The guest particles serve for converting the radiation into electric charges (electrons or holes). Once thermalised, these charges, for example electrons, must leave the guest particles in order to be collected by the electrodes.

In the case of semiconducting guest particles, one can understand the electrical operation of the layer of composite material MC (FIG. 1) by assimilating it to an assembly of condensers mounted in series.

In the absence of electric charges with sufficiently high mobility in the polymer, one uses the fact that the guest particles have a high relative permittivity $\epsilon_d$, for example higher than 10. It is assumed that the polymer itself has a low relative permittivity $\epsilon_p$, for example lower than 5.

The electric field produced in the layer of composite material, whose average value is equal to the ratio of the voltage $v$ applied between the electrodes to the thickness L of the layer of composite material, is applies in unequal manner between the polymer and the semiconductor.

In the absence of radiation, the ratio of the electric field $E_p$ applied to the polymer to the electric field $E_d$ applied to the semiconductor is proportional to the ratio $\epsilon_d/\epsilon_p$ In the presence of radiation, the semiconducting guest particles convert the photons into electric charges and thus become conducting. Their internal electric field $E_d$ then becomes close to 0, the whole electric field being then applied to the polymer and $E_p$ becomes little different from $(v/L) \times (1-X^{1/3})$ where X is the volumic fraction of the guest particles.

This high variation of the internal electric field can encourage efficient migration of the electric charges within the polymer, which is favourable for a good signal/noise ratio for photodetection.

A reading mode by optical method for a detector useful for understanding the invention can also be envisaged. The polymer of the composite layer of this detector or the guest particles must be electroluminescent in impulsive mode (AC electroluminescent). One can also add to the polymer of the composite layer a phosphor which is electroluminescent in impulsive mode, for example.

The growth of the electric field in an electroluminescent polymer in impulsive mode y provokes electroluminescence induced by field effect. In this case the photo-induced current produced by the radiation in the appropriate semi-conducting guest particles is able to be detected or measured by the electroluminescence particular to these particles.

One can use guest particles of $ZnS:Mn^{2+}$, of CaS:Eu, of SrS:Ce or of various semiconductors in the nanocrystalline state, such as porous silicon which can be prepared by cracking hydrides, by decomposition of chlorides by plasma or by electrochemical attack.

One can then use a layer of composite material for example provided with crossed electrodes as in FIG. 2 and the electrodes can be polarised in order to apply, at each of their crossings, a polarisation electric field in the layer. The electroluminescence produced locally in this layer under the impact of the incident radiation is then detected by a two-dimensional array (not shown) of photodetectors placed opposite one of the faces of the layer of composite material.

In the case where one wishes to produce a detector useful for understanding the invention, intended to be an element of a solar radiation sensor (photovoltaic sensor) to convert this radiation into electrical energy, one uses a layer of composite material MC (FIG. 1) made of a polymer such as polythiophene with guest particles such as particles of ZnS.

On either side of this layer one forms two conductive layers, one of which is exposed to the solar radiation and is transparent to it (it is, for example, made of ITO). Between these two conductive layers one applies a voltage making it possible to create the electric field in the layer of composite material and, through the intermediary of the conductive layers, one recuperates the electric charges produced in the layer of composite material under the impact of solar radiation through a junction.

A layer of composite material utilisable in the present invention can be produced in various ways.

For example, one can start with a semiconductor which is satisfactory from the electronic point of view, already in powder state (such semiconductors being available commercially).

The polymer intended to constitute the host matrix is first of all dissolved in a solvent, for example toluene, and then mixed with the semiconductor powder for example using a drum, a mixer-granulator or a pan granulator. Even a simple sedimentation may suffice, and then one pours off the excess solvent to leave the remaining solvent to evaporate. The homogeneous mixture prepared mechanically can be spread out. The solvent then evaporates and leaves a composite layer from several hundreds of micrometers to several millimeters in thickness.

As a variant, one mixes the semiconductor powder with a compatible anti-agglomerate added, with the monomer intended to form the host matrix and, by polymerising, this monomer imprisons the semiconductor grains.

Other industrial techniques making it possible to bind a powder (for example by dissolving it to form a solution or by dispersion or by humidifying this powder) or compacting techniques (of the type used to form tablets) or even extrusion techniques can be used to obtain the layer of composite material.

The mixture of semiconductor and polymer powder dissolved in a volatile solvent can also be spread over a complex and/or very large surface, as in the case of paint spraying.

It can be advantageous to start from basic components (for example zinc powder and tellurium powder, monomer) to reduce costs still further.

Starting from powders of the constitutive elements of a semiconductor material, one can enable the formation of a good semiconducting stoichiometric compound by fusion at high temperature. For this, one can use all the techniques for "rapid solidification" of powders as in the case of lyophilization (using, for example, a drum or turning plate or atomisation in a gaseous current). The powder can then be recuperated dry and then treated as seen above to form the layer of composite material or be taken away directly by the polymer solution (or monomer).

The techniques for synthesis of powders in vapour phase can also be envisaged (for example cracking, chemical deposit in vapour phase or projection in a plasma). In certain cases, the deposit can take place on a cooled substrate, capable of supporting the monomer or polymer in solution, or by simultaneous evaporation of organic molecules, intended to form the polymer host matrix.

One can also use a simultaneous projection technique for the semiconductor powder, by a gaseous current, for example a current of nitrogen, resulting in more or less molten semiconductor droplets, produced through the intermediary of a plasma torch, and also polymers in the form of droplets. In this case, by operating above the natural sintering temperature of the powder, one can envisage using other dielectrics with high fusion points (for example under the form of glass or oxides) to form a cermet.

Using humidity or a sol-gel process, one can also include guest particles of a semiconductor in a host matrix forming an aerogel and containing a little or a lot of polymer.

The electrodes of a detector according to the invention can for example be in metal or in ITO or in conductive glass or in conductive polymer. Metal electrodes can be deposited electrochemically on the layer of composite material whereas electrodes in conductive glass or conductive polymer can be glued to this layer.

FIGS. 4 to 7 show diagrams of two-dimensional detectors of ionizing radiation produced according to the invention. These detectors shown in FIGS. 4 to 7 use a semiconducting composite material. This means that the host matrix is of the insulating polymer or semiconductor type whereas the guest particles are of the semiconductor type.

These detectors can be produced more rapidly and in a less costly way than the two-dimensional ionizing radiation detectors known for example from the following documents:

[1] Jean-louis Gerstenmayer, Damien Lebrun and Claude Hennion, "Multistep parallel plate avalanche chamber as a 2D imager for MeV pulsed radiography", Proc. SPIE, vol. 2859, p. 107 to 114, colloquium 7 to 8 Aug. 1996, Denver, Colo., USA.

[2] J. L. Gerstenmayer, "High DQE performance X- and Gamma-ray fast imagers: emergent concepts", 1998 Symposium on Radiation Detection and Measurement, Ann Arbor, Mich., 11 to 14 May 1998, Proceedings in Nuclear and Methods in Physics Research A.

Figure 4:
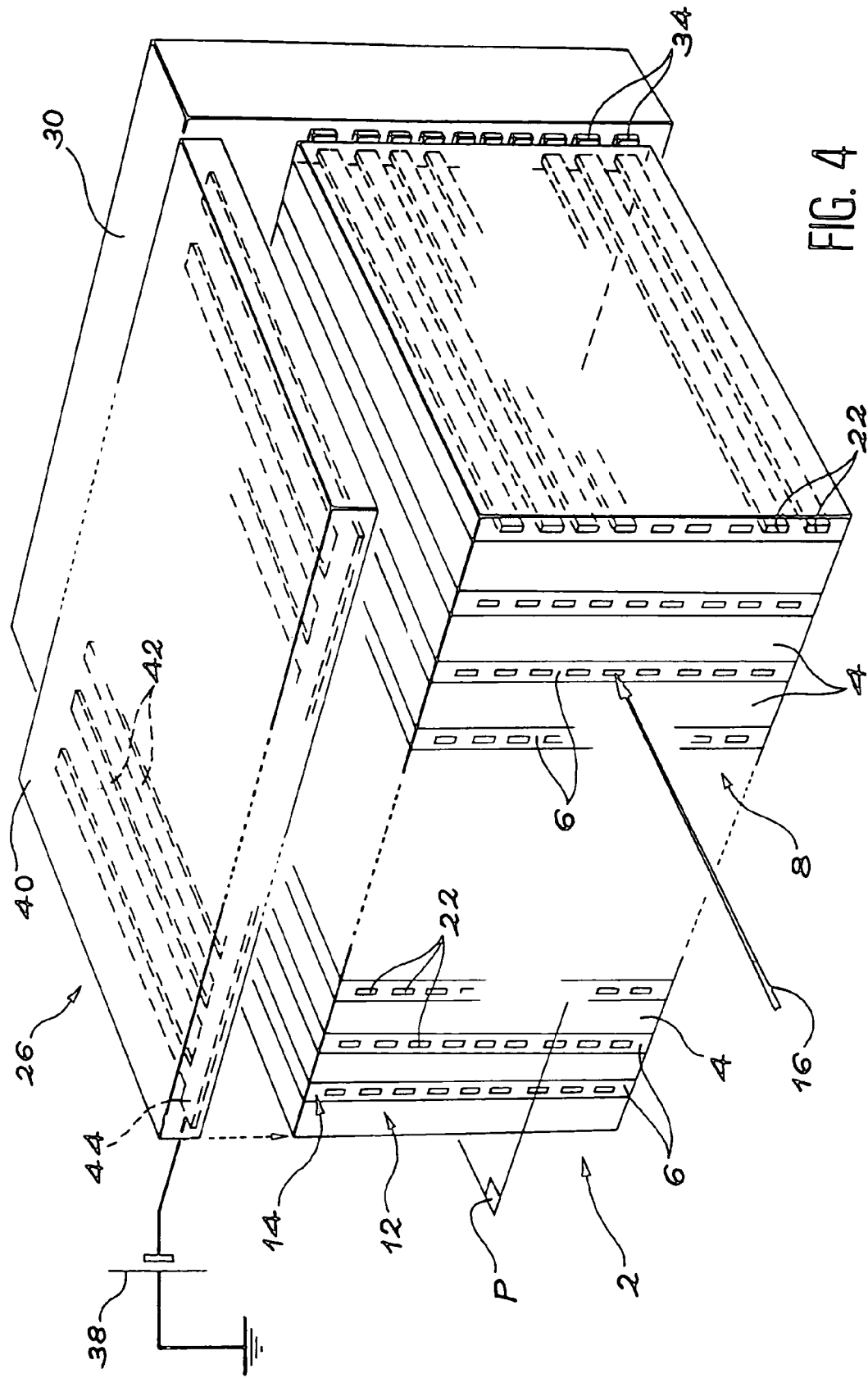
FIG. 4 is a diagrammatic view in perspective of a two-dimensional detector of ionizing radiation according to the invention.
Figure 5:
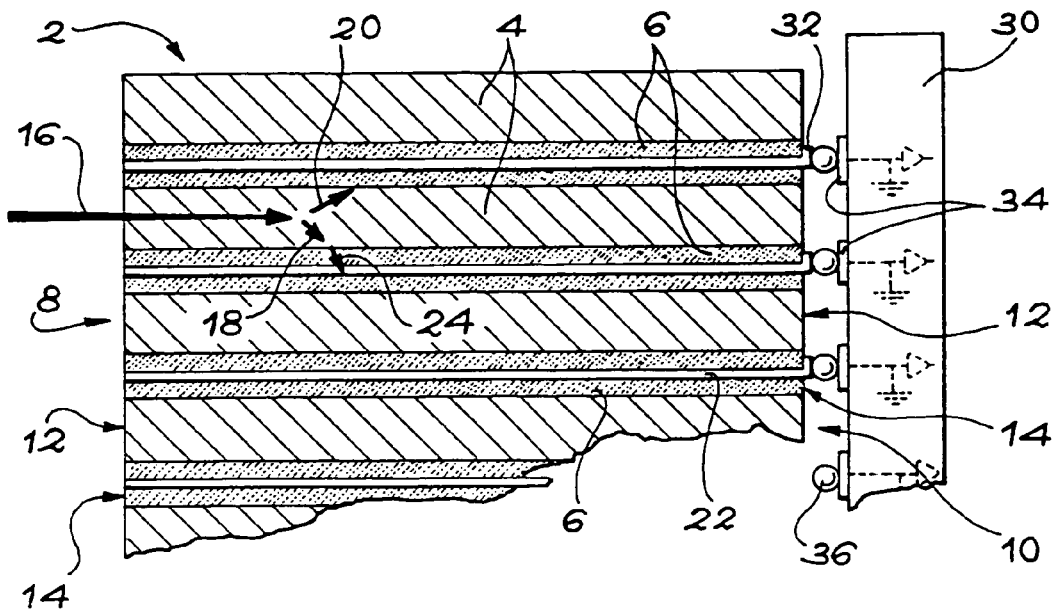
FIG. 5 is a diagrammatic and partial view of the detector of FIG. 4, according to plane P of FIG. 4.

In the example shown in FIGS. 4 and 5, the ionizing radiation is constituted of X photons which, for example, have an energy of 5 MeV.

The detector of FIGS. 4 and 5 comprises a stack 2 of sheets 4 of an electrically conductive material which is capable of emitting electrons by interaction with the X photons of the incident ionizing radiation.

This detector also comprises layers 6 of a semiconducting composite material (whose host matrix is for example in PPV and the guest particles for example in CdTe) which alternate with the sheets 4 and whose guest particles are capable of being ionized by the photo-electrons emitted by the conductive material when the latter interacts with the X photons and possibly directly, even though in a lower proportion, by the primary X photons.

Each of the layers 6 is associated with one of the sheets 4.

The stack of sheets 4 and layers 6 has a first face 8 and a second face 10 which are opposite.

Each of the faces 8 and 10 contains edges 12 of sheets 4 and edges 14 of layers 6 which alternate with the edges 12 of the sheets 4.

The detector of FIGS. 4 and 5 is arranged in such a way that the sheets 4 and the layers 6 are substantially parallel to the direction of the ionizing radiation to be detected and that this radiation arrives on face 8.

The length of each sheet 4, counted from the face 8 to the face 10, is at least equal to the tenth of the mean free path of the X photons in the conductive material constituting the sheets 4.

As can be seen in FIGS. 4 and 5, an incident X photon, whose trajectory has reference 16 in FIGS. 4 and 5, interacts with the conductive material of a sheet 4 to produce, by Compton effect, photoelectric or pair creation, an electron with high kinetic energy, whose trajectory is represented by the arrow 18 in FIG. 5.

In FIG. 5 an arrow 20 also represents the trajectory of the photon with energy lower than that of the incident X photon, which results from the interaction between the latter and the conductive material of sheet 4.

The detector of FIGS. 4 and 5 also comprises groups of parallel and electrically conductive tracks 22 which extend from the face 8 to the face 10, parallel to the layers 6.

Each group of tracks 22 is associated with one of the layers 6 and in contact with it.

The tracks 22 are intended to collect charge carriers which are produced in the layers 6 by interaction of guest particles of the latter with the electrons resulting from the interaction of incident X photons with the conductive material constituting the sheets 4.

These charge carriers are representative, in intensity and in position, of the incident X photons.

FIG. 5 shows a charge carrier whose trajectory has the reference 24 and which results from the interaction of the electron with trajectory 18 with the guest particles of a layer 6 and this charge carrier, with trajectory 24, is collected by a conductive track 22 associated with this layer 6.

The detector also comprises means 26 (FIG. 4) for creating the electric field able to provoke the transport of charge carriers and then collection of the latter by tracks 22.

In the example shown in FIGS. 4 and 5, each group of conductive tracks 22 is contained in the layer 6 with which this group is associated.

This avoids having to use electrically insulating supports (for example in plastic or ceramic material) for the tracks, supports which take up space and which reduce the spatial resolution of the detector, and which moreover do not contribute to the actual detection itself.

In the case of these FIGS. 4 and 5, the means 26 are means for applying an electric voltage between the tracks 22 and the sheets 4, this voltage being able to provoke the transport of charge carriers and then their collection by the tracks 22.

It is to be noted that the plane of the cross-section P (FIG. 4) crosses the conductive tracks of a single row of tracks (a horizontal row in FIG. 4), the tracks of this row belonging respectively to the layers 6.

It can also be seen in FIG. 4 that each group of tracks is substantially contained in a plane perpendicular to the plane P and that this group extends substantially from the top of the associated layer 6 to the bottom of it.

In a special embodiment of the invention, not shown, the material constituting the sheets 4 is still electrically conductive but the tracks 22 are no longer contained within the layers 6: each group of tracks is located at the interface of the corresponding layer 6 and the sheet of conductive material associated to an adjacent layer 6.

In this case, an electrically insulating material is provided to insulate the tracks 22 of the sheets 4 of conductive material but one can still use the same means 26 as before.

The detector of FIGS. 4 and 5 is provided with an electronic device 30 for reading the electric signals provided by the tracks 22 when the latter collect the charge carriers.

It can be seen in FIG. 5 than one end 32 of each track 22 is bent back to extend over one edge 14 of the corresponding layer 6, this edge being located on the face 10 of the stack of sheets 4 and layers 6.

The electronic reading device 30 comprises electrically conductive pads 34 which are respectively in contact with the bent ends 32 of the tracks 22.

This contact can be made through the intermediary of brazed balls 36, for example balls of indium, or through the intermediary of electrically conductive wires or even by applying the bent ends of the tracks against the pads of the associated reading device, by appropriate means, for example by pressing or with an electrically conductive glue.

It is to be noted that the pads 34 are arranged at the same spacing as the bent ends 32 of the tracks 22.

One can use a non-doped semiconducting composite material or, on the contrary a doped semiconducting composite material of the N type, in which case the electrons are the majority charge carriers, or of the P type in which case the majority carriers are the holes.

In order to collect the charge carriers, one can put the conductive sheets 4 at a negative potential and earth the conductive pads 34 (and therefore the tracks 22) or one can earth the sheets 4 and put the conductive pads 34 (and therefore the tracks 22) at a positive potential.

In the two cases the holes produced in the layers 6 are attracted by the sheets 4 of conductive material whereas the electrons produced in these layers 6 are attracted by the tracks 22 and collected by the latter, thus supplying the electric signals which are read by the device 30.

Inversely, one can put the sheets 4 at a positive potential and earth the pads 34 or earth the sheets 4 and put the pads 34 at a negative potential. In the two cases the electrons are attracted by the sheets and the holes are attracted by the tracks and collected by them, again providing the electric signals which are read by the device 30.

In each case, the tracks 22 convert, into digital and electrical form, the analog image which is transported by the X-rays which are detected.

In the example shown in FIG. 5, all the tracks 22 are earthed through the intermediary of electrically conductive pads 34 and all the sheets of conductive material are put at a negative potential by a voltage source 38.

In this case, the tracks 22 collect the electrons.

In order to put all the sheets 4 of conductive material at a negative potential (for example equal to −500 V), one uses an electrically insulating plate 40 with one face with electrically conductive parallel tracks 42, formed with a spacing equal to that of the sheets 4.

All these tracks 42 are linked to a track 44 also formed on this face of the plate 40 and this track 44 is connected to the negative voltage source 38.

One then applies the face of the plate 40 carrying the tracks 42 onto a face of the stack 2 on which also appear the edges of the sheets 4, this face being different from faces 8 and 10, in such a way that the tracks 42 come into contact respectively with the edges of the sheets 4, which makes it possible to bring all these sheets 4 to the desired negative potential.

The plate 40 is, for example made of a ceramic or a polymer and with the tracks 42 and 44 in gold.

The elements 38, 40, 42 and 44 constitute the means 26 mentioned above.

Preferably, for reasons of size and speed of reading, the electronic reading device 30 is of the type used in CCD sensors.

For a detector of modest dimensions, one can connect the tracks 22 of the stack 2 directly to the pixels of a CCD sensor without coating.

In the case of a detector with greater dimensions, one can provide an intermediary connection matrix between the tracks 22 of the stack 2 and the reading device, for example of the CCD type.

The conductive pads 34 are then set on one of the faces of this matrix to be connected respectively to the bent-back ends 32 of the tracks 22 and these pads are connected electrically to the pixels of a reading device for example of the CCD type through the intermediary of electrical connections which cross this matrix.

The thicknesses of the sheets 4 of conductive material (or insulator as will be seen below) and the layers 6 are fixed to optimise the spatial resolution of the detector and the conversion yield (conversion and collection of charges). Preferably, one seeks thicknesses as low as possible, typically of the order of 100 µm to several hundred micrometers.

As an example, one can use sheets 4 of conductive material whose thickness is of the order of 200 µm and layers 6 whose thickness is of the order of 200 µm.

It should be noted that the structure of a detector of the type shown in FIGS. 4 and 5 makes it possible, relative to hole detectors known in prior art from documents [1] and [2], to improve the yield in a spectacular way (of the order of 50%), with an appropriate thickness of material according to the direction of the radiation to detect, and the spatial resolution, which can be of the order of 100 µm by choosing an appropriate spacing for the tracks 22.

In fact, in the direction perpendicular to the sheets 4 the spatial resolution is determined by the spacing between the sheets 4 and between the tracks (which can be of the order of 50 µm to 200 µm).

For detecting X-rays, preferably one uses a heavy metal, for example tungsten or lead.

As a purely indicative and non-limiting example, in the case where one wishes to detect X photons with energy of 5 MeV, one uses a detector 2 cm thick (counting from face 8 to face 10 in FIG. 1), layers 6 of PPV 100 µm thick where particles of CdTe are dispersed, and sheets 4 of tungsten of 400 µm thickness with tracks 22 with a spacing of 0.5 mm. These dimensions can be reduced if this is necessary, a spacing of 100 µm being technologically feasible.

In the following, one gives an example of a method of manufacture of the detector of FIGS. 4 and 5.

The sheets 4 of conductive material can be produced by any process whatsoever.

Their surface must be sufficiently conductive and non-oxidised.

This surface can be coated, if necessary, with a metallic deposit more adapted to producing an ohmic contact with the material of layers 6, for example a layer of gold.

On the layers 6, in order to form the tracks 22 which can be in gold or in a metal better adapted to the semiconducting composite material used, one can proceed in the following way:

in a manner explained above, one forms a first thickness of semiconducting composite material (for example 50 µm) on one of the faces of one of the conductive sheets 4.

tracks 22 in gold with, for example, a width of 5 µm, are deposited by evaporation through a mask or by a photolithography process, on the semiconducting composite material thus deposited, and a second thickness of semiconducting composite material is deposited on the first thickness in such a way as to cover the tracks 22 and to obtain the total required thickness of semiconducting composite material (for example 100 µm).

One proceeds in the same way for each conducting sheet 4.

As a variant, one can also deposit, on the two opposite faces of two successive sheets, a half-layer of semiconducting composite material and then form the group of tracks on one of the half-layers.

Conductive sheets 4 thus covered are then stacked in such a way as to obtain alternate conductive sheets 4 and layers 6 and are maintained in contact together by a light pressure exerted by appropriate means, for example a mechanical device, or by an electrically conductive glue.

Figure 6:
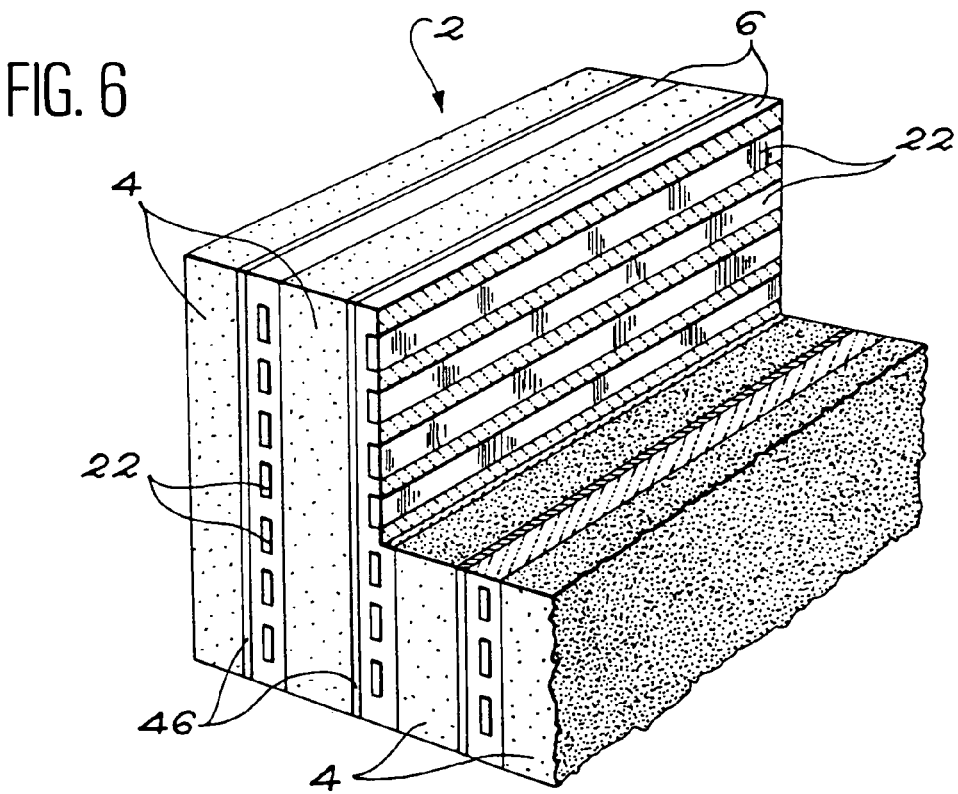
FIG. 6 is a diagrammatic cross-section in perspective of an embodiment variant of the detector of FIG. 4.

The detector according to the invention, which is shown diagrammatically in cross-section in perspective in FIG. 6, differs from that of FIG. 4 by the fact that the sheets 4 are electrically insulating, for example in plastic material, in the case of FIG. 6, with the aim of detecting neutrons, for example, and by the fact that between each sheet of insulating material 4 and the corresponding layer 6 one interposes an electrically conductive thin film (thickness of the order of 5 µm to 10 µm), for example in gold or in copper, as shown in FIG. 6.

In this case one can furthermore bring all the electrically conductive layers 46 to the electrical potential required relative to the tracks 22, through the intermediary of electrically conductive tracks of the type of tracks 42 formed on the insulating plate 40 (FIG. 4).

Figure 7:
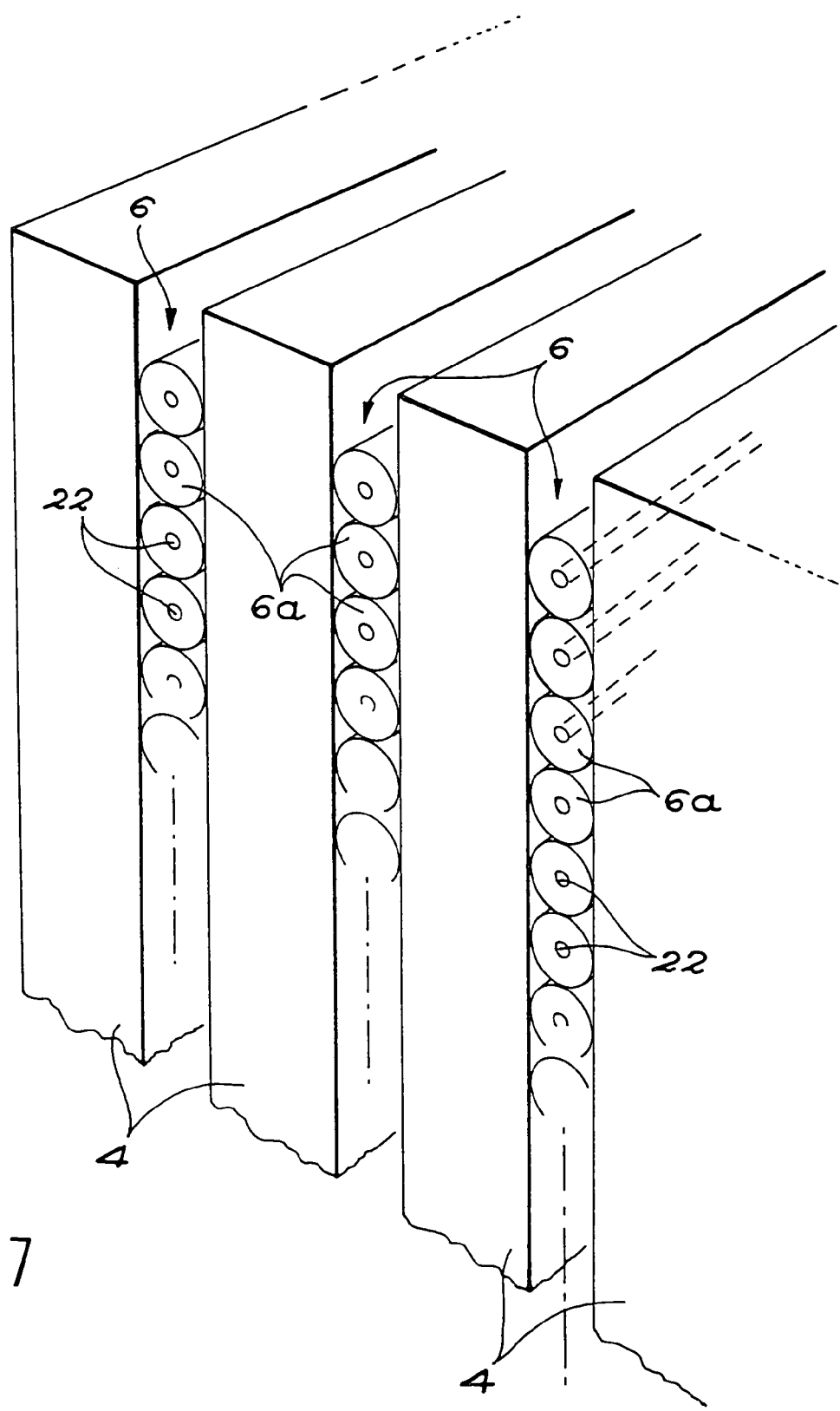
FIG. 7 is a diagrammatic and partial view of another embodiment variant of the detector of FIG. 4.

FIG. 7 is a diagrammatic partial view in perspective of an embodiment variant of the detector of FIG. 4.

In the detector of FIG. 7, each layer 6 is a strand of juxtaposed wires 6a made of the semiconducting composite material, each wire containing, following its axis, a metallic wire constituting a track 22. The wires 6a provided for these tracks 22 can be obtained by extrusion.

The invention claimed is:

1. Detector of incident ionizing radiation constituted of primary particles, this detector being characterised in that it comprises:

layers of a semiconducting composite material comprising a host matrix made of a polymer and guest particles of the semiconductor type dispersed throughout the host matrix, at least these guest particles being capable of interacting directly or indirectly with the radiation, electric charges being produced in the layers of the composite material from the interaction of the guest particles with the radiation, means for creating an electric field in the layers of composite material, the host matrix being capable of transporting the electric charges under the action of this electric field and thus making it possible to exploit these electric charges, and a stack of sheets of a first material which is capable of emitting secondary particles by interaction with the incident ionising radiation, the layers of composite material alternating with the sheets of the first material and being able to be ionized by the secondary particles, each of the layers being associated with one of the sheets, the stack having first and second opposite faces, each containing respective edges of sheets and layers, the detector being intended to be oriented such that the ionizing radiation arrives on the first face, the length of each sheet, counted from the first to the second face, being at least equal to the tenth of the mean free path of the primary particles in the first material, the means for creating the electric field comprising, for each layer, a group of parallel and electrically conductive tracks which extend from the first to the second face, parallel to this layer, and which are in contact with it, the tracks also being intended to collect the charges produced in this layer by interaction between it and the secondary particles and possibly with the primary particles and which are representative, in intensity and in position, of the primary particles, the electric field also being capable of provoking the collection of charges by the tracks.

2. Detector according to claim 1, in which the polymer is chosen from the group comprising semiconducting polymers and electrically insulating polymers.

3. Detector according to claim 2, in which the mobility of the electric charges in the polymer is greater than $10^{-6}$ cm$^2$/V/s.

4. Detector according to claim 1, in which the mobility of the electric charges in the polymer is greater than $10^{-6}$ cm$^2$/V/s.

5. Detector according to claim 4, in which the polymer is chosen from the group comprising polyphenylenevinylene, polythiophene, polyaniline, polypyrrol and polydiacetylene.

6. Detector according to claim 5, in which the guest particles are capable of producing electric charges by direct interaction with the incident radiation or by interaction with other electric charges produced by interaction of this incident radiation with the host matrix.

7. Detector according to claim 1, in which the guest particles are capable of producing electric charges by direct interaction with the incident radiation or by interaction with other electric charges produced by interaction of this incident radiation with the host matrix.

8. Detector according to claim 7, in which the guest particles are chosen from the group comprising grains of at least one semiconductor powder and semiconducting colloidal particles.

9. Detector according to claim 1, in which the guest particles are chosen from the group comprising grains of at least one semiconductor powder and semiconducting colloidal particles.

10. Detector according to claim 9, in which the guest particles have a mean atomic number higher than 14, an average density greater than 2 g·cm$^{-3}$ and an average relative permittivity greater than 10.

11. Detector according to claim 1, in which the guest particles have a mean atomic number higher than 14, an average density greater than 2 g·cm$^{-3}$ and an average relative permittivity greater than 10.

12. Detector according to claim 11, in which the guest particles are coated in a material preventing agglomeration of these guest particles.

13. Detector according to claim 1, in which the guest particles are coated in a material preventing agglomeration of these guest particles.

14. Detector according to claim 13, in which the first material is electrically conductive, the tracks are electrically insulated from the sheets and the means for creating the electric field furthermore comprise means for applying an electric voltage between the tracks and the sheets, this voltage being able to provoke collection of charges by the tracks.

15. Detector according to claim 13, in which each group of tracks is contained in the layer with which it is associated.

16. Detector according to claim 13, in which the sheets are electrically insulating, an electrically conductive layer is interposed between each layer of composite semiconducting material and the sheet associated with it and the means of creation of the electric field furthermore comprise means for application of an electric voltage between the tracks and the electrically conductive layers, this voltage being capable of provoking the collection of charges by the tracks.

17. Detector according to claim 1, in which the first material is electrically conductive, the tracks are electrically insulated from the sheets and the means for creating the electric field furthermore comprise means for applying an electric voltage between the tracks and the sheets, this voltage being able to provoke collection of charges by the tracks.

18. Detector according to claim 1, in which each group of tracks is contained in the layer with which it is associated.

19. Detector according to claim 18, in which the first material is electrically conductive and the means for creating the electric field further comprise means for applying an electric voltage between the tracks and the sheets, this voltage being able to provoke collection of charges by the tracks.

20. Process for manufacturing the detector according to claim 19, in which a first thickness of composite material is formed on each sheet and then the tracks are formed on this first thickness and then a second thickness of composite material is formed on the first thickness so as to cover the tracks, and then the sheets are stacked so as to obtain alternate sheets and layers.

21. Process for manufacturing the detector according to claim 19, in which, on two opposite faces of two successive sheets, a half-layer of composite material is deposited, then the group of tracks is formed on one of the half-layers, and then the sheets are stacked in such a way as to obtain alternate sheets and layers.

22. Detector according to claim 1, in which the sheets are electrically insulating, an electrically conductive layer is interposed between each layer of composite semiconducting material and the sheet associated with it and the means of creation of the electric field furthermore comprise means for application of an electric voltage between the tracks and the electrically conductive layers, this voltage being capable of provoking the collection of charges by the tracks.

* * * * *